(12) United States Patent
Terauchi

(10) Patent No.: US 7,476,583 B2
(45) Date of Patent: Jan. 13, 2009

(54) SEMICONDUCTOR DEVICE AND METHOD OF MANUFACTURING THE SAME

(75) Inventor: Takashi Terauchi, Suita (JP)

(73) Assignee: Renesas Technology Corp., Tokyo (JP)

( * ) Notice: Subject to any disclaimer, the term of this patent is extended or adjusted under 35 U.S.C. 154(b) by 154 days.

(21) Appl. No.: 11/713,655

(22) Filed: Mar. 5, 2007

(65) Prior Publication Data
US 2007/0164345 A1     Jul. 19, 2007

Related U.S. Application Data

(62) Division of application No. 11/209,847, filed on Aug. 24, 2005, now Pat. No. 7,315,061.

(30) Foreign Application Priority Data
Aug. 27, 2004    (JP)   .............................. 2004-248250

(51) Int. Cl.
    *H01L 21/336*      (2006.01)
(52) U.S. Cl. ...................... 438/201; 438/257; 438/265; 438/593; 257/E21.691
(58) Field of Classification Search ................ 438/201, 438/257, 259, 264, 593, 594, 265; 257/E21.691
See application file for complete search history.

(56) References Cited

U.S. PATENT DOCUMENTS 5,847,427 A * 12/1998 Hagiwara .................... 257/324
6,630,392 B2 * 10/2003 Kim et al. .................... 438/586
7,064,380 B2 * 6/2006 Fukumura et al. ........... 257/315
2004/0164340 A1 * 8/2004 Arai et al. .................... 257/315
2005/0051832 A1    3/2005 Fukumura et al.

FOREIGN PATENT DOCUMENTS

| JP | 7-249697 A | 9/1995 |
|---|---|---|
| JP | 2005-85903 A | 3/2005 |

* cited by examiner

*Primary Examiner*—Michael Trinh
(74) *Attorney, Agent, or Firm*—McDermott Will & Emery LLP

(57) ABSTRACT

An insulating film provided below a floating gate electrode includes a first insulating film located at both end portions below the floating gate electrode, and a second insulating film sandwiched between the first insulating films and located in a middle portion below the floating gate electrode. The first insulating film and the second insulating film are formed in separate steps, and the first insulating film is thicker than the second insulating film. With this structure, when an insulating film is provided between the floating gate electrode and a silicon substrate to have a thickness more increased at its end portion than at its middle portion, the thickness can be increased more freely and a degree of the increase can be controlled more readily.

4 Claims, 14 Drawing Sheets

EFFECTIVE CHANNEL LENGTH

EFFECTIVE CHANNEL LENGTH

SEMICONDUCTOR DEVICE AND METHOD OF MANUFACTURING THE SAME

RELATED APPLICATIONS

This application is a divisional of U.S. patent application Ser. No. 11/209,847, filed Aug. 24, 2005, now U.S. Pat. No. 7,315,061 which claims priority from Japanese Patent Application No. JP 2004-248250 filed Aug. 27, 2004 the contents of which are hereby incorporated by reference.

BACKGROUND OF THE INVENTION

1. Field of the Invention

The present invention relates to a semiconductor device and a method of manufacturing the same, and, in particular, to a semiconductor device having a non-volatile semiconductor memory device such as an EEPROM (Electrically Erasable Programmable Read Only Memory) or a flash memory and a method of manufacturing the same.

2. Description of the Background Art

A non-volatile semiconductor memory device having a floating gate electrode and a control gate electrode has conventionally been used. Generally, an insulating film is provided between the floating gate electrode and a silicon substrate.

Japanese Patent Laying-Open No. 7-249697 discloses such a non-volatile semiconductor memory device. In a semiconductor device described in Japanese Patent Laying-Open No. 7-249697, an insulating film between a floating gate electrode and a silicon substrate has a thickness increased at its end portion. The increase in the film thickness is due to formation of a bird's beak caused by thermal oxidization.

SUMMARY OF THE INVENTION

In the semiconductor device described in Japanese Patent Laying-Open No. 7-249697, the insulating film between the floating gate electrode and the silicon substrate has a thickness increased at its end portion due to formation of a bird's beak caused by thermal oxidization. Therefore, in the insulating film between the floating gate electrode and the silicon substrate, it has been difficult to arbitrarily control a ratio between a film thickness at its middle portion and a film thickness at its end portion.

Consequently, the present invention is made to solve the aforementioned problem, and one object of the present invention is to provide a semiconductor device in which, when an insulating film is provided between a floating gate electrode and a silicon substrate to have a thickness more increased at its end portion than at its middle portion, the thickness can be increased more freely and a degree of the increase can be controlled more readily, and a method of manufacturing the same.

According to a semiconductor device in accordance with the present invention, the semiconductor device includes a semiconductor substrate having a main surface, an insulating film formed on the main surface of the semiconductor substrate, a floating gate electrode formed on the main surface of the semiconductor substrate via the insulating film, and a control gate electrode extending above the floating gate electrode. The insulating film has a first insulating film located at both end portions below the floating gate electrode, and a second insulating film sandwiched between the first insulating films and located in a middle portion below the floating gate electrode. The first insulating film and the second insulating film are formed in separate steps, and the first insulating film is thicker than the second insulating film.

According to a method of manufacturing a semiconductor device in accordance with the present invention, the method is provided for manufacturing a semiconductor device including a semiconductor substrate having a main surface, an insulating film formed on the main surface of the semiconductor substrate, a floating gate electrode formed on the main surface of the semiconductor substrate via the insulating film, and an assist gate electrode provided on both sides of the floating gate electrode via a side wall to form an inversion layer in the semiconductor substrate, the insulating film having a first insulating film located at both end portions below the floating gate electrode and a second insulating film sandwiched between the first insulating films and located in a middle portion below the floating gate electrode, and the first insulating film being thicker than the second insulating film. The method includes the steps of forming the assist gate electrode at an appropriate position on the main surface of the semiconductor substrate, performing thermal oxidization on the surface of the semiconductor substrate sandwiched between the assist gate electrodes to form a thermal oxide film serving as the first insulating film, forming the side wall made of a silicon oxide film on a side of the assist gate electrode and removing a middle portion of the oxide film, and performing wet etching to reduce a surface of the side wall and an inner end portion of the oxide film simultaneously.

According to the semiconductor device and a method of manufacturing the same in accordance with the present invention, when the insulating film is provided between the floating gate electrode and the silicon substrate to have a thickness more increased at its end portion than at its middle portion, the thickness can be increased more freely and a degree of the increase can be controlled more readily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Firstly, prior to describing embodiments in accordance with the present invention, explanation will be given on a structure of a semiconductor device serving as a technical basis for the embodiments and a method of manufacturing the same. The semiconductor device is proposed in Japanese Patent Laying-Open No. 2005-085903. The semiconductor device includes a plurality of non-volatile memory cells each having an assist gate electrode, a control gate electrode provided to intersect the assist gate electrode, and a floating gate electrode for storing charge provided at a point where the control gate electrode intersects with an interval between the adjacent assist gate electrodes, with insulated from the assist gate electrode and the control gate electrode. The assist gate electrode has a function of forming an inversion layer in a semiconductor substrate, and the inversion layer is used as an interconnection.

Figure 1:
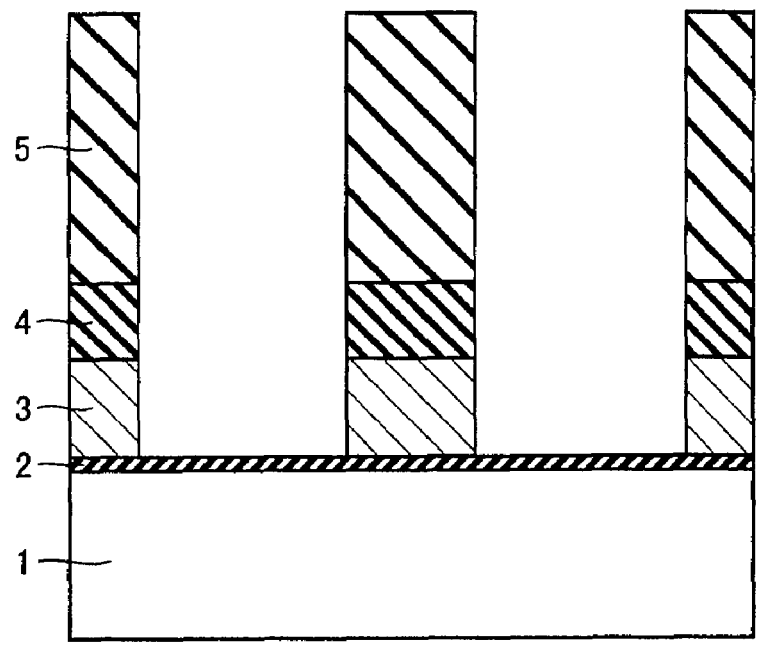
FIGS. 1 to 7 are cross sectional views illustrating steps of manufacturing a semiconductor device serving as a basis for the present invention.

FIGS. 1 to 7 show main steps of manufacturing the semiconductor device having such an assist gate electrode. In FIG. 1, a thermal oxide film 2 is formed on a semiconductor substrate 1. On thermal oxide film 2, conductor films 3 are formed at an appropriate interval. Conductor film 3 is made of such as a low-resistance polysilicon film doped with P, As, or the like. Conductor film 3 constitutes the assist gate electrode described above, and is patterned to be regularly arranged in a direction vertical to the plane of the drawing. On conductor film 3, a nitride film 4 and a silicon oxide film 5 are provided.

Figure 2:
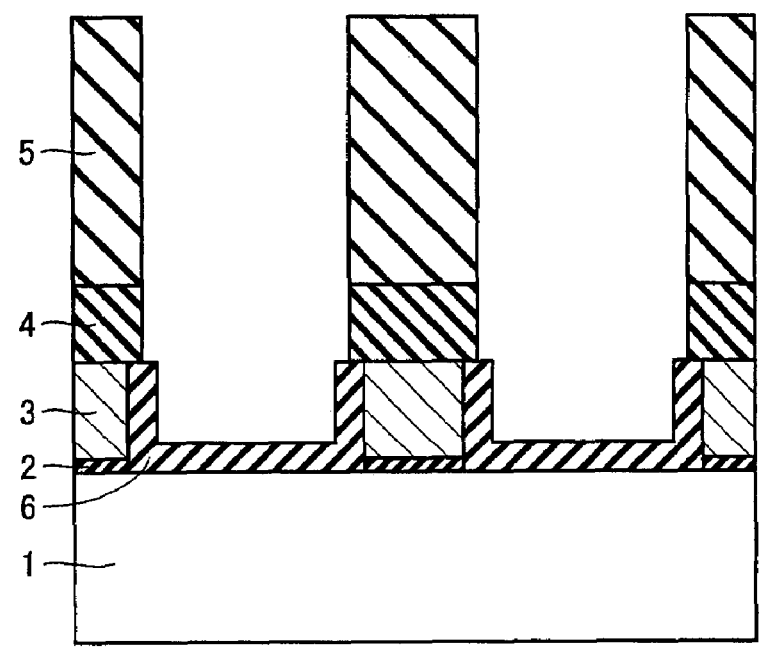

Referring to FIG. 2, the side of conductor film 3 constituting the assist gate electrode and the surface of semiconductor substrate 1 are simultaneously oxidized by thermal oxidization. Thereby, a thermal oxide film 6 is formed on the side of conductor film 3 and the surface of semiconductor substrate 1. The thickness of thermal oxide film 6 formed on a portion where conductor film 3 is not provided is greater than the thickness of thermal oxide film 2 already formed between conductor film 3 and semiconductor substrate 1.

Figure 3:
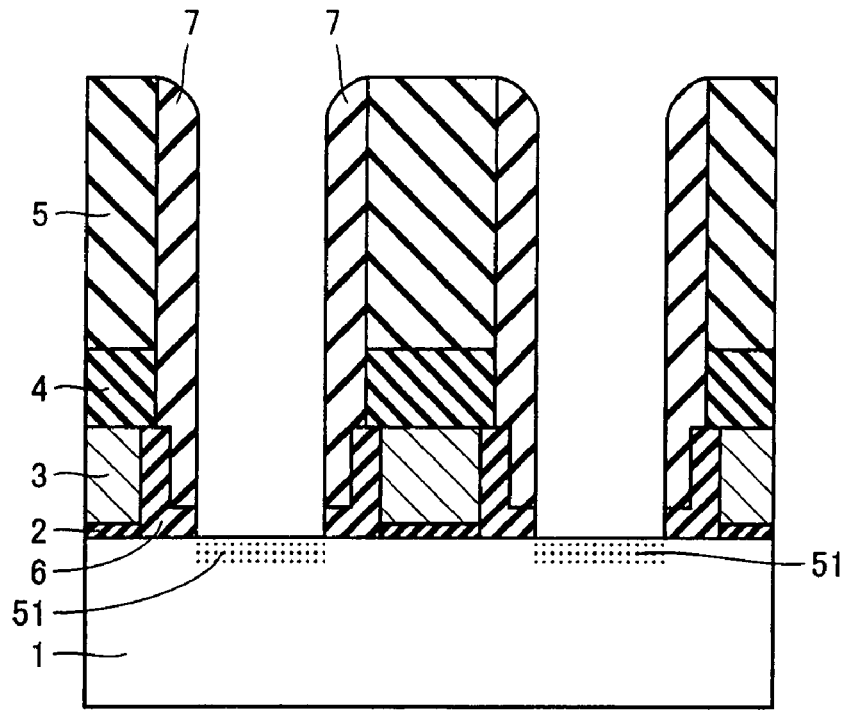

Referring to FIG. 3, a silicon oxide film 7 is deposited all over semiconductor substrate 1, and thereafter a portion of silicon oxide film 7 is removed by dry etching. Thereby, a side wall made of silicon oxide film 7 is provided on the inner side of thermal oxide film 6 formed adjacent to the side of conductor film 3 as well as on the sides of nitride film 4 and silicon oxide film 5. At the same time, an etching damage layer 51 containing carbon or the like produced as a result of dry etching is formed in semiconductor substrate 1 at a portion close to the surface sandwiched between the side walls. If etching damage layer 51 remains, it can result in defective leakage.

Figure 4:
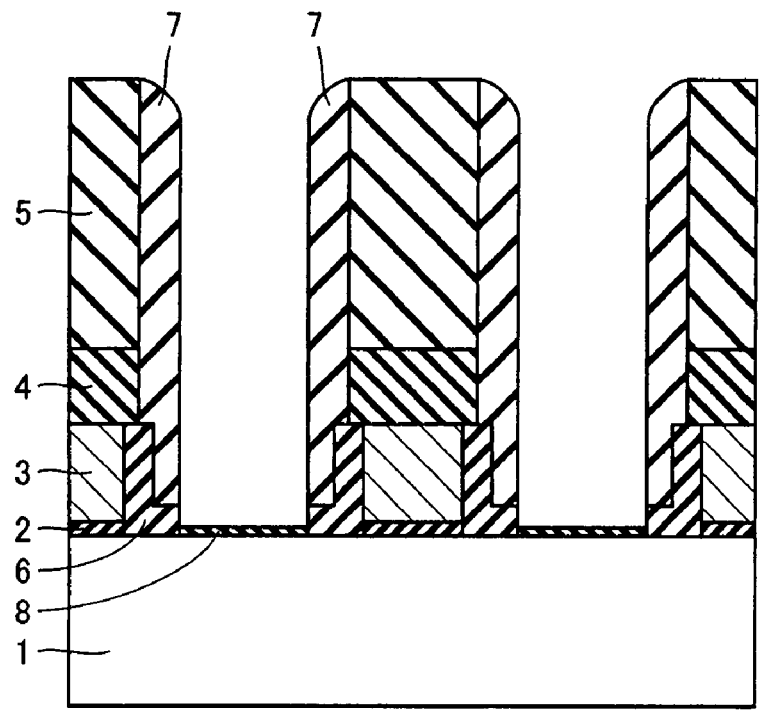

Referring to FIG. 4, a thermal oxide film 8 is formed on the main surface of semiconductor substrate 1. Thermal oxide film 8 serves as a tunnel oxide film of the floating gate electrode.

Figure 5:
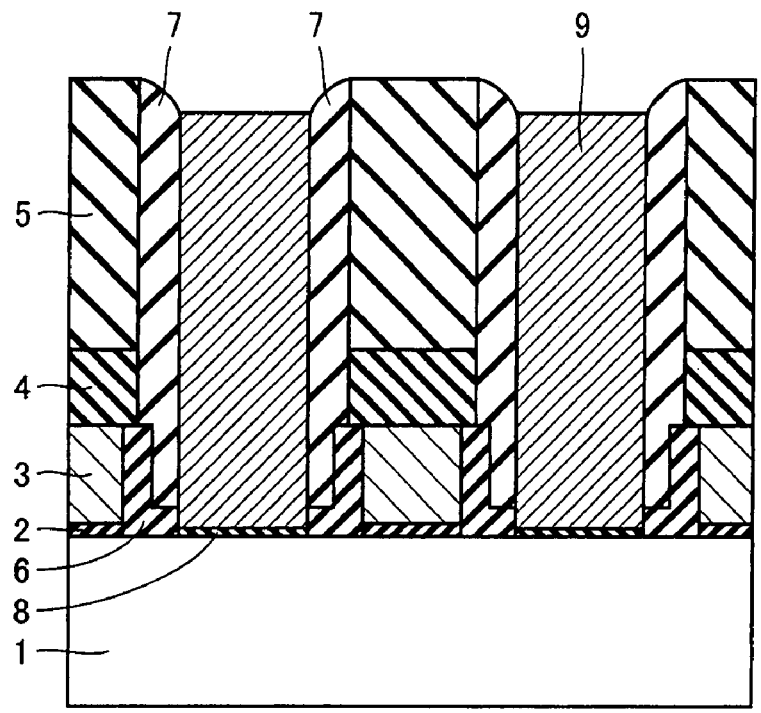

Referring to FIG. 5, a conductor film 9 such as a low-resistance polysilicon film doped with P, As, or the like is deposited on the main surface of semiconductor substrate 1 by for example CVD (Chemical Vapor Deposition). Dry etching is then performed on the surface of conductor film 9. The surface of conductor film 9 is removed by dry etching until conductor film 9 fits into a position sandwiched between a pair of silicon oxide films 7 constituting the side walls. As a result, the upper surface of conductor film 9 becomes lower than the upper surface of silicon oxide film 5 in height.

Figure 6:
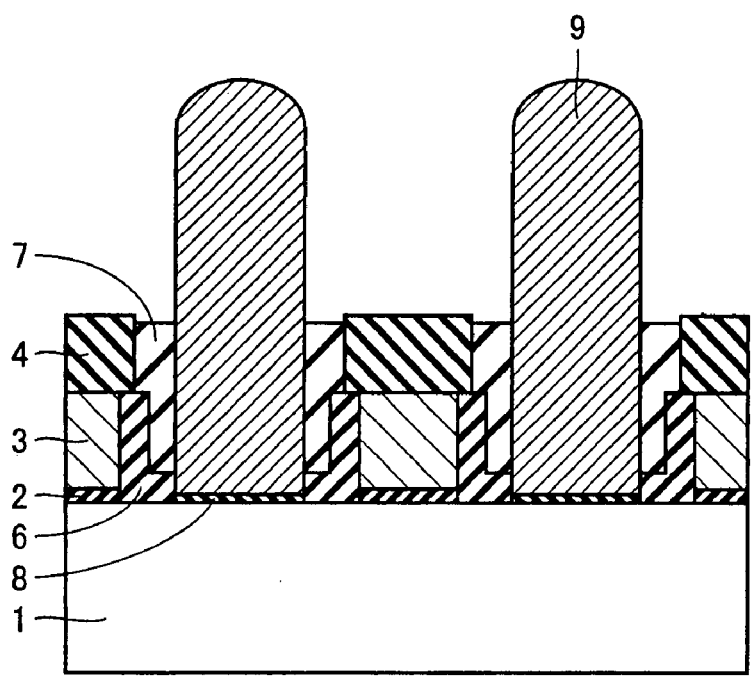

Referring to FIG. 6, dry etching is performed only on the memory cell portion. Through dry etching, silicon oxide film 5 is removed, and silicon oxide film 7 is also removed until the upper surface of silicon oxide film 7 is located adjacent to the side of nitride film 4. Thereby, conductor film 9 sandwiched between conductor films 3 constituting the assist gate electrodes and having the upper surface higher than that of conductor film 3 is formed, serving as the floating gate electrode.

Figure 7:
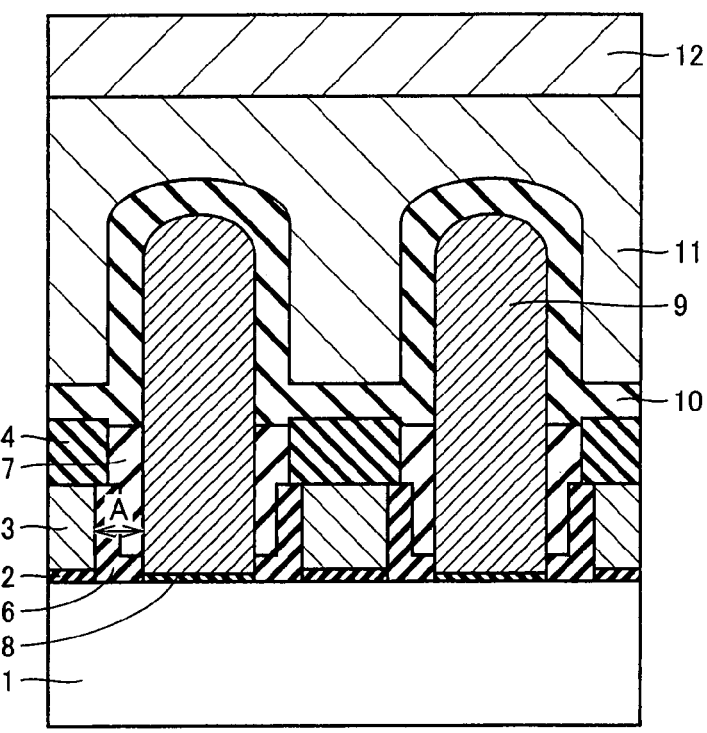

Referring to FIG. 7, an ONO film 10, a conductor film 11, and a conductor film 12 are deposited in order on the main surface of semiconductor substrate 1. Conductor film 11 is made of such as a low-resistance polysilicon film doped with P, As, or the like, and conductor film 12 is made of such as a high melting point metal silicide film such as WSi. Conductor films 11 and 12 are patterned to extend in a direction orthogonal to conductor film 3 constituting the assist gate electrode, serving as the control gate electrode. In FIG. 7, a dimension indicated by A is a thickness of an insulating film insulating conductor film 9 constituting the floating gate electrode from conductor film 3 constituting the assist gate electrode. If this distance A is short, current leakage occurs between conductor film 3 and conductor film 9. Therefore, distance A cannot be shortened without careful consideration.

Next, explanation will be given on write, read, and erase operations in the semiconductor device described above constituting a flash memory. In data write, voltage is applied to a predetermined assist gate electrode, and thus a predetermined memory cell is selected (a selected memory cell). The data write is performed by source side hot electron injection method. With this method, high-speed, low-current, and efficient data write is implemented. Individual memory cells can store data having multiple values. This multiple value storage is implemented by changing write time for each memory cell while maintaining write voltage applied to a word line connected to a control gate electrode at a constant voltage to form memory cells having different threshold levels. For example, four values such as "00", "01", "10", "11" or more can be stored. Therefore, one memory cell can function as two or more memory cells. As a result, miniaturization of the flash memory can be achieved.

In the data write operation, a voltage of for example about 15 V is applied to a word line to which the selected memory cell is connected, and a voltage of for example about 0 V is applied to a word line other than that word line. In addition, a voltage of for example about 1 V is applied to an assist gate electrode for forming a source in the selected memory cell, and a voltage of for example about 7 V is applied to an assist gate electrode for forming a drain (typically, an assist gate electrode adjacent to the assist gate electrode for forming a source). Thereby, an inversion layer serving as a source or a drain is formed on the main surface of the semiconductor substrate facing the assist gate electrode described above. On the other hand, a voltage of for example about 0 V is applied to an assist gate electrode other than those described above, and an inversion layer is not formed on the main surface of the semiconductor substrate facing that assist gate electrode. Thereby, isolation between the selected memory cell and the non-selected memory cell is achieved. Further, a voltage of for example about 4 V is applied to a bit line connected to the inversion layer serving as the drain in the selected memory cell. On this occasion, while a voltage of for example about 0 V is applied to a bit line connected to the inversion layer serving as the source in the selected memory cell, a voltage of for example about 1.2 V is applied to a bit line connected to an inversion layer serving as a source in the non-selected memory cell. Thereby, in the selected memory cell, write current flows from the drain to the source, and charge stored in the inversion layer on the source side is injected into the floating gate electrode via the thermal oxide film. In contrast, in the non-selected memory cell, no current flows from the drain to the source, and no charge is injected into the floating gate electrode. Through the above operation, the data write is selectively performed for the predetermined memory cell.

In data read operation, the operation is performed in the reverse order of the data write operation. In this case, a voltage of for example about 2 V to 5 V is applied to a word line to which the selected memory cell is connected, and a voltage of for example about 0 V is applied to a word line other than that word line. In addition, a voltage of for example about 5 V is applied to an assist gate electrode for forming a source or a drain in the selected memory cell. Thereby, the source or the drain is formed in the selected memory cell. On the other hand, a voltage of for example about 0 V is applied to an assist gate electrode corresponding to a source or a drain in the non-selected memory cell. Thereby, an inversion layer serving as a source or a drain is not formed in the non-selected memory cell. As a result, isolation between the selected memory cell and the non-selected memory cell is achieved. Here, a voltage of for example about 1 V is applied to a bit line connected to an inversion layer serving as the drain in the selected memory cell, and a voltage of for example 0 V is applied to a bit line other than that bit line. Further, a voltage of for example about 0 V is applied to a bit line connected to an inversion layer serving as the source in the selected memory cell. Here, a threshold voltage of the selected memory cell varies depending on the state of charge stored in the floating gate electrode. Accordingly, data in the selected memory cell can be determined from the state of the current flowing between the source and the drain of the memory cell. Through the above operation, the read operation can be performed for the memory cell storing multiple values.

In data erase operation, a positive voltage is applied to the semiconductor substrate while a negative voltage (for example about −16V) is applied to a word line to be selected. Note that a voltage of about 0 V is applied to the assist gate electrode, and no inversion layer is formed. Thereby, charge is released from the floating gate electrode to the semiconductor substrate. The release is performed by F-N (Fowler-Nordheim) tunnel release. Through the above operation, data in a plurality of memory cells can be erased at one time.

Figure 8:
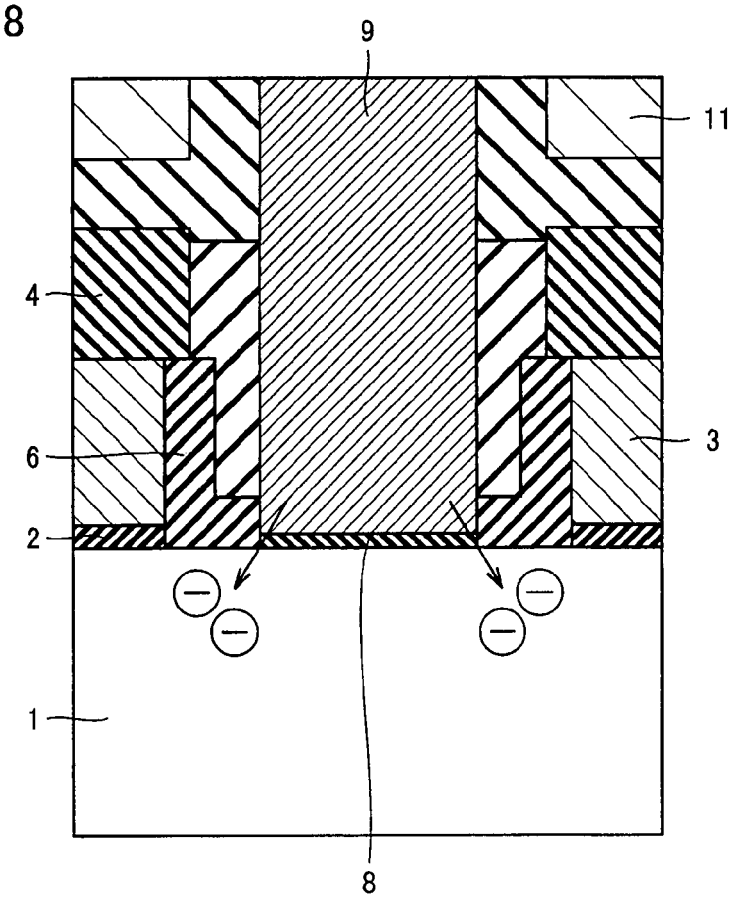
FIGS. 8 to 10 are cross sectional views illustrating operations in the semiconductor device serving as the basis for the present invention.

In the semiconductor device described above, conductor film 9 constituting the floating gate electrode has a flat bottom, and its end portion is shaped like a square edge. When conductor film 9 constituting the floating gate electrode is formed as described above, an electric field concentrates on the edge when the erase operation is performed using F-N tunnel release. As a result, an electron is likely to leak from conductor film 9 constituting the floating gate electrode as shown in FIG. 8, and thus it has been difficult to control an erase level.

Figure 9:
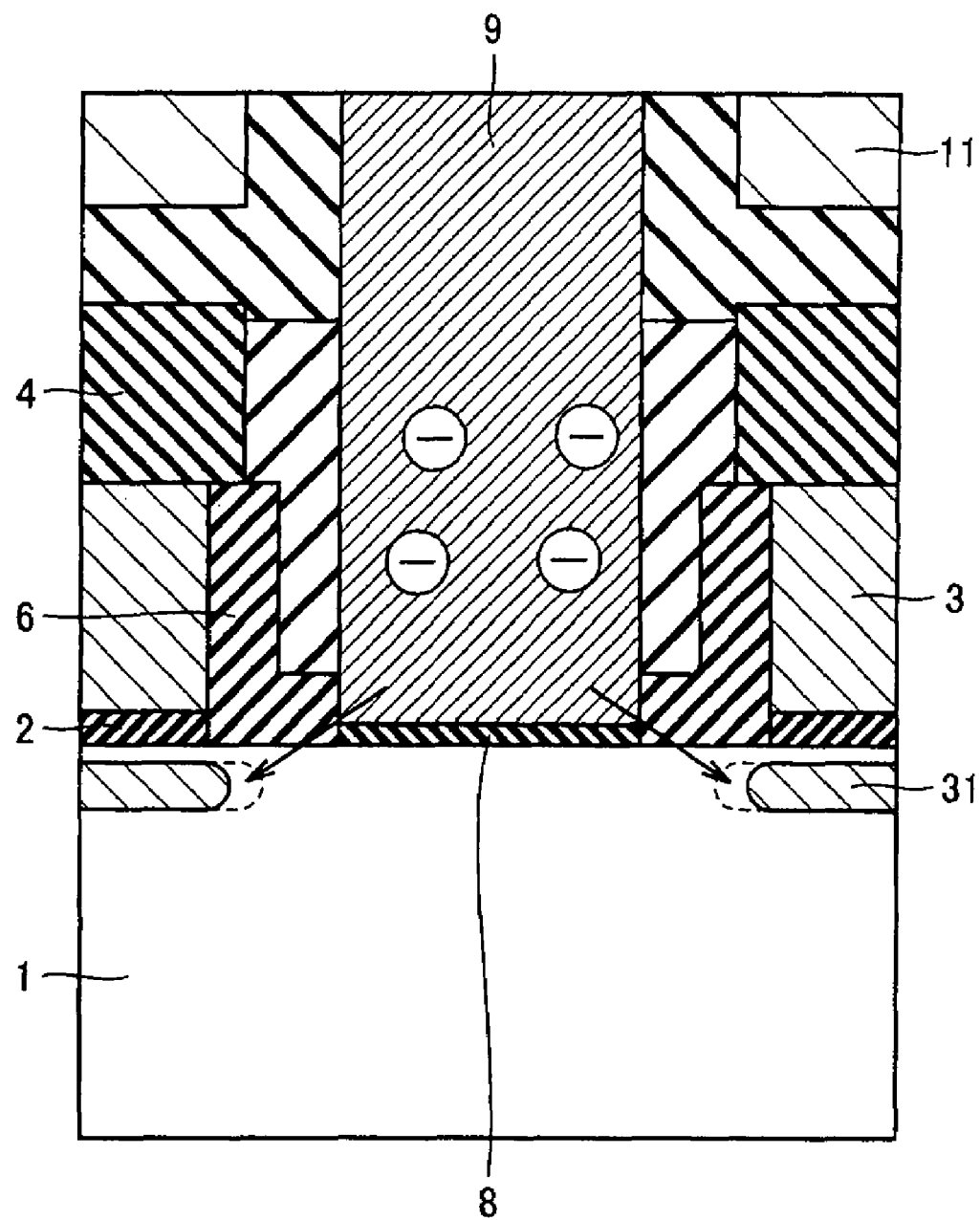
Figure 10:
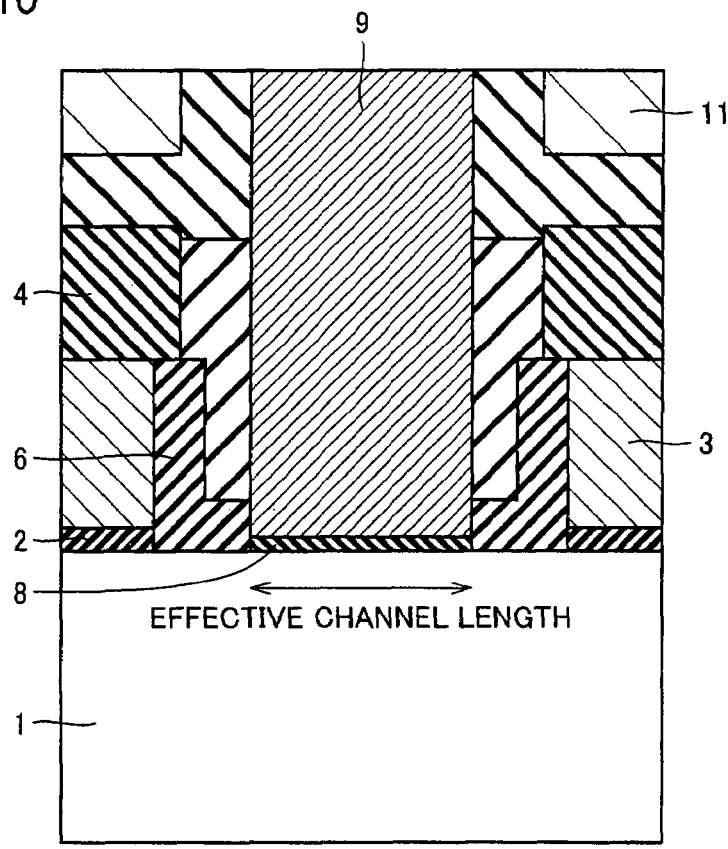

Further, in the case of a flash memory which is provided with the assist gate electrode described above and uses the inversion layer formed by the assist gate electrode as an interconnection, when an electron is injected into the floating gate electrode, the inversion layer is affected by a potential of the floating gate electrode. As a result, as shown in FIG. 9, an inversion layer 31 has a shorter channel width, and the inversion layer has an increased resistance. This leads to a problem that properties of the memory cell are deteriorated. Furthermore, along with the advance of miniaturization of semiconductor devices, an effective channel length below the floating gate electrode as shown in FIG. 10 has been becoming shorter. The resulting increase in punchthrough leakage has also been becoming a problem.

Embodiments which will be described below solve these problems and further improve operation performance. It is to be noted that, although explanation has been given on the flash memory with an assist gate electrode as the semiconductor device described above serving as the basis for the present invention, and explanation will also be given on the flash memory with an assist gate electrode in the following embodiments, the present invention is applicable not only to the flash memory having this structure but also to a non-volatile semiconductor memory device having no assist gate electrode.

First Embodiment

Figure 16:
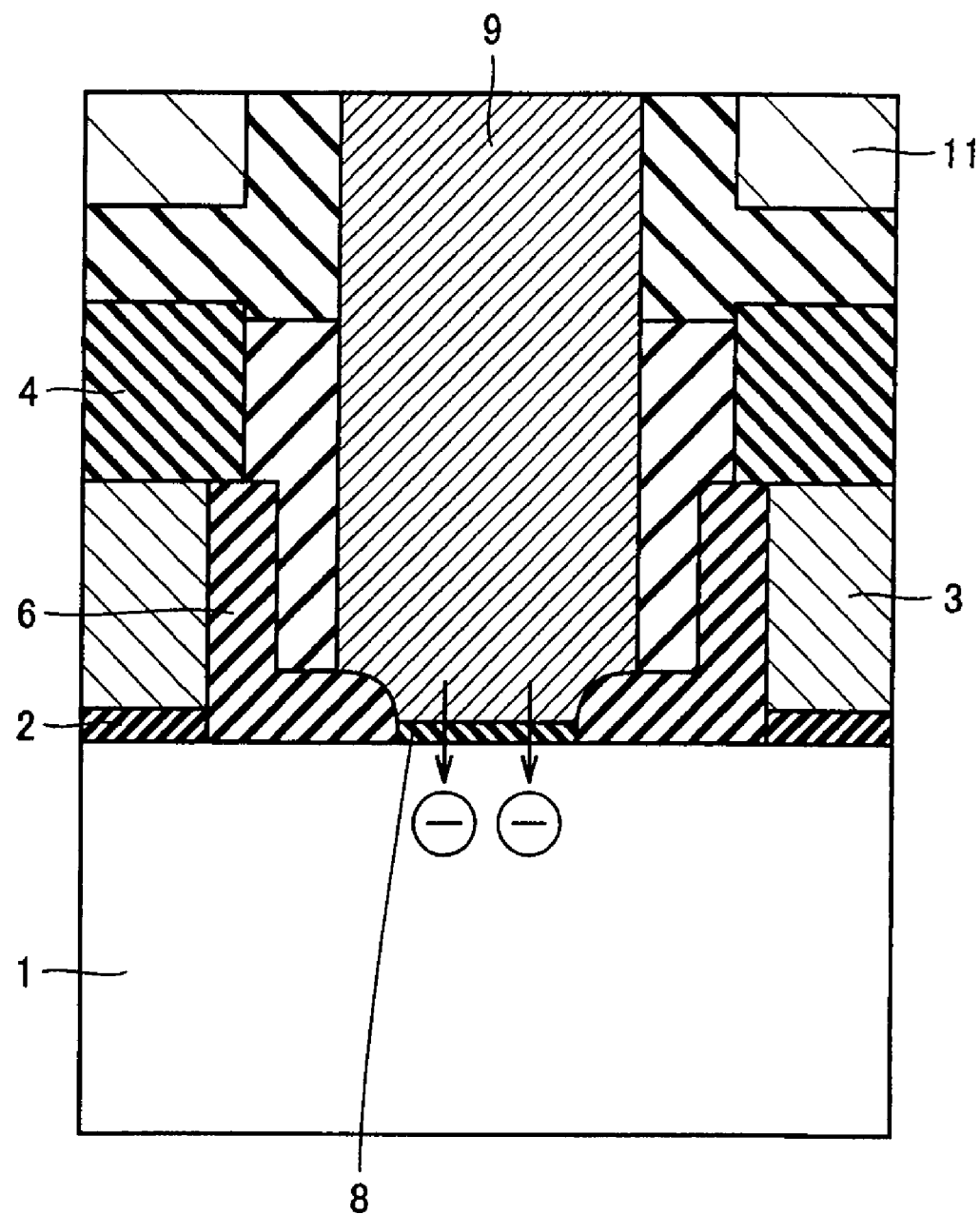
FIGS. 16 and 17 are cross sectional views illustrating operations in the semiconductor device of the first embodiment in accordance with the present invention.
Figure 17:
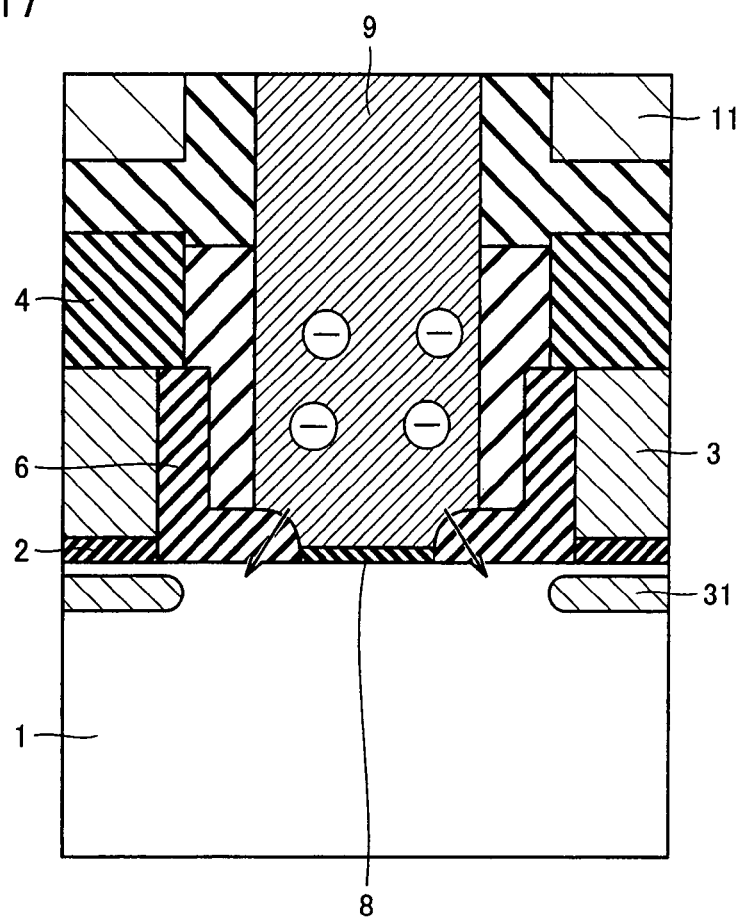

In the following, a first embodiment in accordance with the present invention will be described with reference to FIGS. 11 to 17. FIGS. 11 to 15 are cross sectional views illustrating steps in a method of manufacturing a semiconductor device in the present embodiment, and FIGS. 16 and 17 are cross sectional views illustrating operations in the semiconductor device. These cross sectional views each show a cross section taken in a direction in which the control gate electrode extends. In the following description, components corresponding to those in the semiconductor device described above serving as the basis for present embodiment are indicated by like reference numerals.

A semiconductor device in the present embodiment includes semiconductor substrate 1 having a main surface, an insulating film (thermal oxide films 6, 8) formed on the main surface of semiconductor substrate 1, and a floating gate electrode (conductor film 9) formed on the main surface of semiconductor substrate 1 via the insulating film. In the semiconductor device, the insulating film has a first insulating film (thermal oxide film 6) located at both end portions below the floating gate electrode, and a second insulating film (thermal oxide film 8) sandwiched between the first insulating films and located in a middle portion below the floating gate electrode. The first insulating film and the second insulating film are formed in separate steps, and the first insulating film is thicker than the second insulating film. Further, a portion of the first insulating film extending from the upper surface of the first insulating film to the upper surface of the second insulating film has a rounded shape.

The method of manufacturing the semiconductor device will be described below. Up to the step shown in FIG. 2 described above, the method is the same as the steps of manufacturing the semiconductor device serving as the basis for the present embodiment. In the present embodiment, following this step, referring to FIG. 11, silicon oxide film 7 is deposited all over semiconductor substrate 1 and thereafter a portion of silicon oxide film 7 is removed by dry etching. Thereby, a side wall made of silicon oxide film 7 is provided on the side of thermal oxide film 6 formed adjacent to the side of conductor film 3 as well as on the sides of nitride film 4 and silicon oxide film 5. On this occasion, a distance B shown in FIG. 11, indicating a distance between conductor film 3 and the surface of silicon oxide film 7 constituting the side wall, is set to be greater than distance A shown in FIG. 7, in order to ultimately obtain distance B equivalent to distance A after further reduction of silicon oxide film 7 in a later step.

Figure 12:
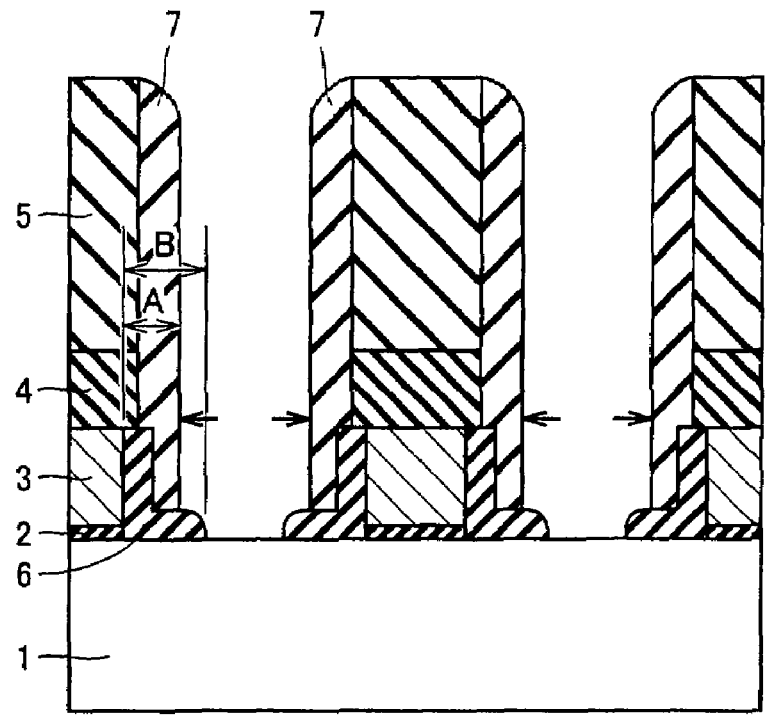

Referring to FIG. 12, an HF-based wet etching solution is used to reduce the surface of silicon oxide film 7 and the inner end portion of thermal oxide film 6. Since the silicon oxide film generally has an etching rate faster than that of the thermal oxide film, a structure as shown in FIG. 12 is obtained, in which silicon oxide film 7 is more reduced than thermal oxide film 6 in thickness. At the same time, a corner of the inner end portion of thermal oxide film 6 is removed, and the inner end portion of thermal oxide film 6 has a gently rounded shape. On this occasion, as shown in FIG. 12, the distance between the surface of silicon oxide film 7 constituting the side wall and the surface of conductor film 3 constituting the assist gate electrode is set to be identical to A as in FIG. 7.

Figure 13:
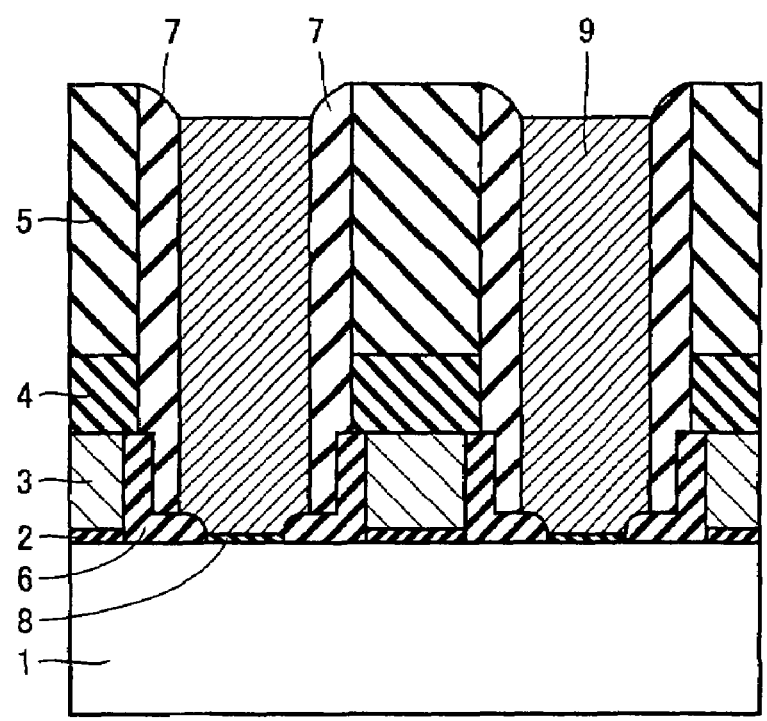

Referring to FIG. 13, thermal oxide film 8 is formed on the main surface of semiconductor substrate 1. Thermal oxide film 8 serves as a tunnel oxide film of the floating gate electrode. Thermal oxide film 8 (the second insulating film) is formed to be thinner than thermal oxide film 6 (the first insulating film). Further, conductor film 9 such as a low-resistance polysilicon film doped with P, As, or the like is deposited on the main surface of semiconductor substrate 1 by for example CVD. Thereafter, dry etching is performed on the surface of conductor film 9. Conductor film 9 is removed by dry etching until conductor film 9 fits into a position sandwiched between a pair of silicon oxide films 7 constituting the side walls. As a result, the upper surface of conductor film 9 becomes lower than the upper surface of silicon oxide film 5 in height.

Figure 14:
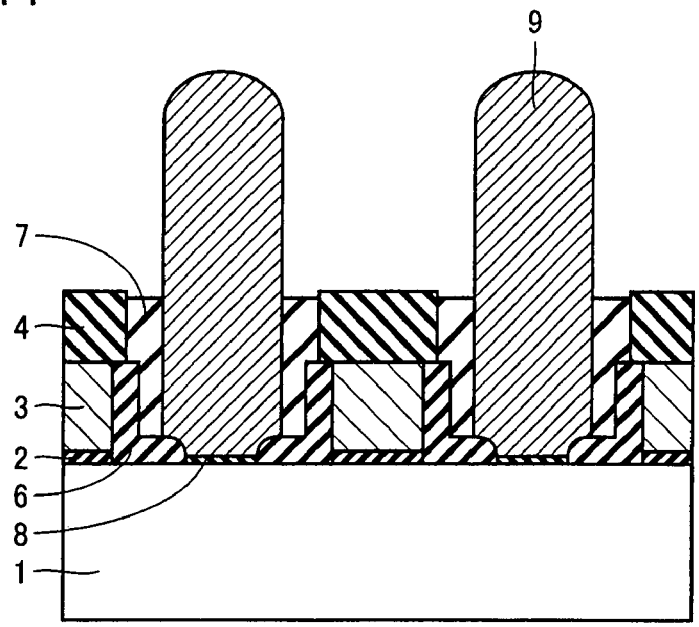

Referring to FIG. 14, dry etching is performed only on the memory cell portion. Through dry etching, silicon oxide film 5 is removed, and silicon oxide film 7 is also removed until the upper surface of silicon oxide film 7 is located adjacent to the side of nitride film 4. Thereby, conductor film 9 sandwiched between conductor films 3 constituting the assist gate electrodes and having the upper surface higher than that of conductor film 3 is formed, serving as the floating gate electrode.

Figure 15:
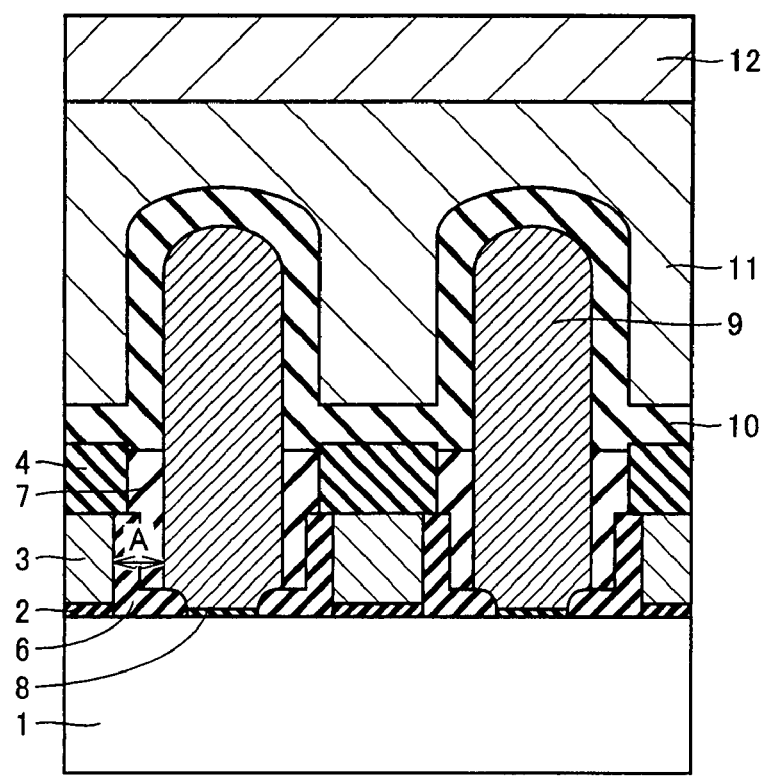

Referring to FIG. 15, ONO film 10, conductor film 11, and conductor film 12 are deposited in order on the main surface of semiconductor substrate 1. Conductor film 11 is made of such as a low-resistance polysilicon film doped with P, As, or the like, and conductor film 12 is made of such as a high melting point metal silicide film such as WSi. Conductor films 11 and 12 are patterned to extend in a direction orthogonal to conductor film 3 constituting the assist gate electrode, serving as the control gate electrode. Since distance A shown in FIG. 15 is identical to distance A in FIG. 7, a sufficient distance can be obtained between conductor film 9 constituting the floating gate electrode and conductor film 3 constituting the assist gate electrode. Thereby, insulation between the floating gate electrode and the assist gate electrode can be ensured. As a result, occurrence of current leakage therebetween can be prevented.

According to the method of manufacturing the semiconductor device, since the first insulating film (thermal oxide film 6) and the second insulating film (thermal oxide film 8) are formed in separate steps, their thicknesses can be controlled arbitrarily. Therefore, the first insulating film can be formed thicker than the second insulating film as appropriate.

According to the semiconductor device in the present embodiment, as described above, the first insulating film (thermal oxide film 6) located at the both end portions below the floating gate electrode is formed thicker than the second insulating film (thermal oxide film 8) located in the middle portion below the floating gate electrode, when seen from a direction orthogonal to the direction in which the control gate electrode extends. This structure can prevent concentration of an electric field on the edge of the floating gate electrode when the erase operation shown in FIG. 16 is performed by F-N tunnel release, reducing variations in the erase level. Further, since the surface of the first insulating film is formed to have a rounded shape in a cross section taken in the direction in which the control gate electrode extends, the concentration of the electric field on that portion can further be relieved.

Furthermore, since the second insulating film (thermal oxide film 8) is formed thicker, a distance between the floating gate electrode (conductor film 9) and an inversion layer formed in semiconductor substrate 1 by the assist gate electrode (conductor film 3) is increased. Consequently, as shown in FIG. 17, even in the writing mode in which charge is injected into the floating gate electrode, it is possible to prevent the inversion layer formed below the assist gate electrode from being affected by the charge. This can prevent an increase in the resistance of the inversion layer due to reduction in the width of the inversion layer. As a result, an error during data read can be reduced, and a potential reached during data write can be improved.

Although explanation has been given on the semiconductor device having an assist gate electrode in the present embodiment, the invention in accordance with the present embodiment is also applicable to a semiconductor device having no assist gate electrode, and effects similar to those described above can also be obtained in such a case.

Second Embodiment

Figure 23:
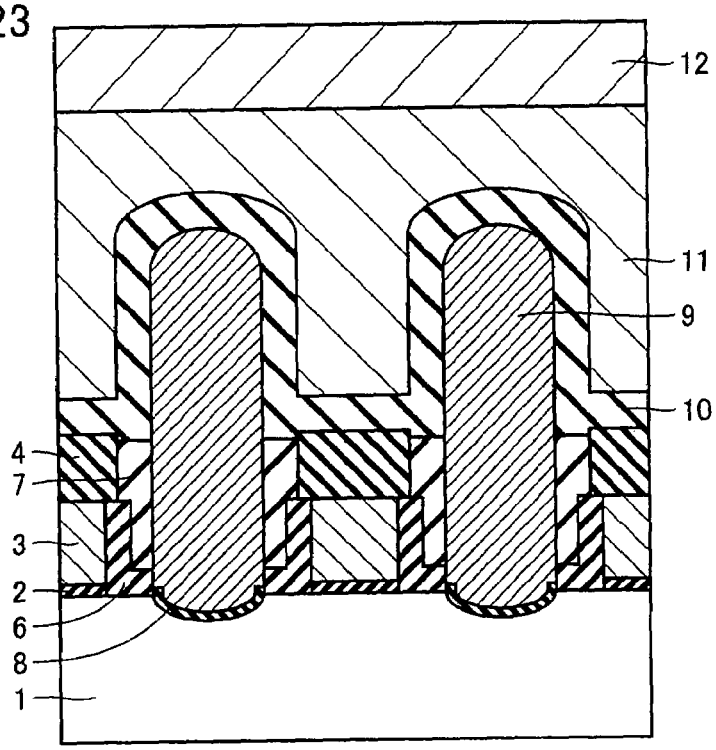
FIG. 23 is a cross sectional view illustrating an application example of the second embodiment in accordance with the present invention.
Figure 24:
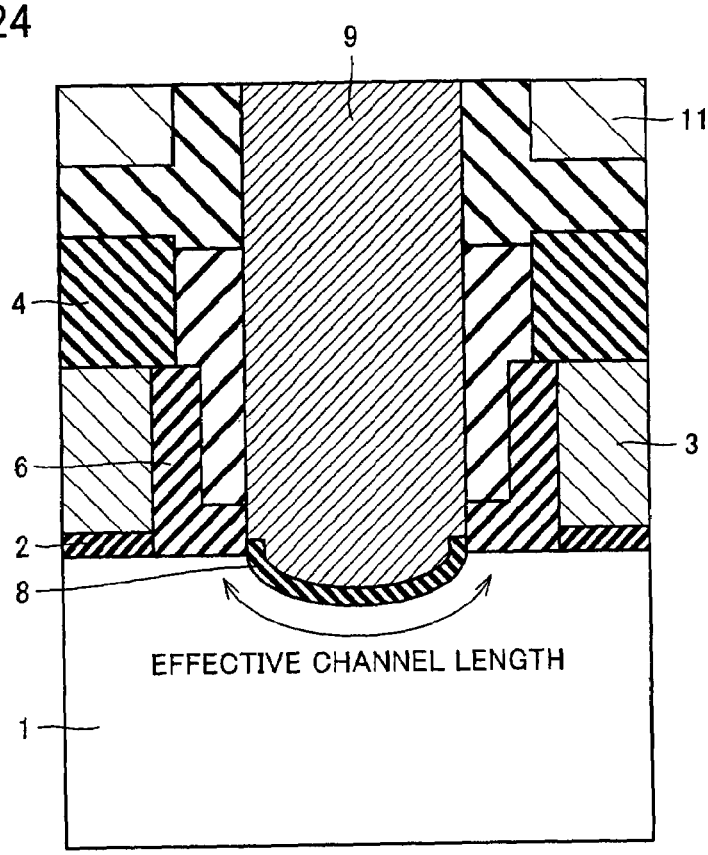
FIG. 24 is a cross sectional view illustrating an operation in the application example of the second embodiment in accordance with the present invention.

Next, a second embodiment will be described with reference to FIGS. 18 to 24. In the following description, components corresponding to those in the first embodiment are indicated by like reference numerals. FIGS. 18 to 22 are cross sectional views illustrating steps in a method of manufacturing a semiconductor device in the present embodiment, and FIGS. 23 and 24 are cross sectional views illustrating application examples of the present embodiment.

The first embodiment and the present embodiment have different structures as described below. In the first embodiment, thermal oxide film 8 constituting the second insulating film is formed flat, with a substantially uniform thickness. In contrast, in the present embodiment, at least a portion of the lower surface of thermal oxide film 8 constituting the second insulating film is located lower than the surface of semiconductor substrate 1, and the lower surface of the second insulating film has a rounded shape.

The method of manufacturing the semiconductor device will be described below. Up to the step shown in FIG. 11 described above, the method is the same as the method of manufacturing the semiconductor device in the first embodiment. In the present embodiment, following this step, referring to FIG. 18, anisotropic dry etching is performed to form a recess in the surface of semiconductor substrate 1 sandwiched between the first insulating films (thermal oxide films 6). This can remove an etching damage layer containing carbon or the like formed in semiconductor substrate 1 at a portion close to the surface sandwiched between the first insulating films (thermal oxide films 6) in the step shown in FIG. 11, reducing defective leakage resulting from the layer.

Figure 19:
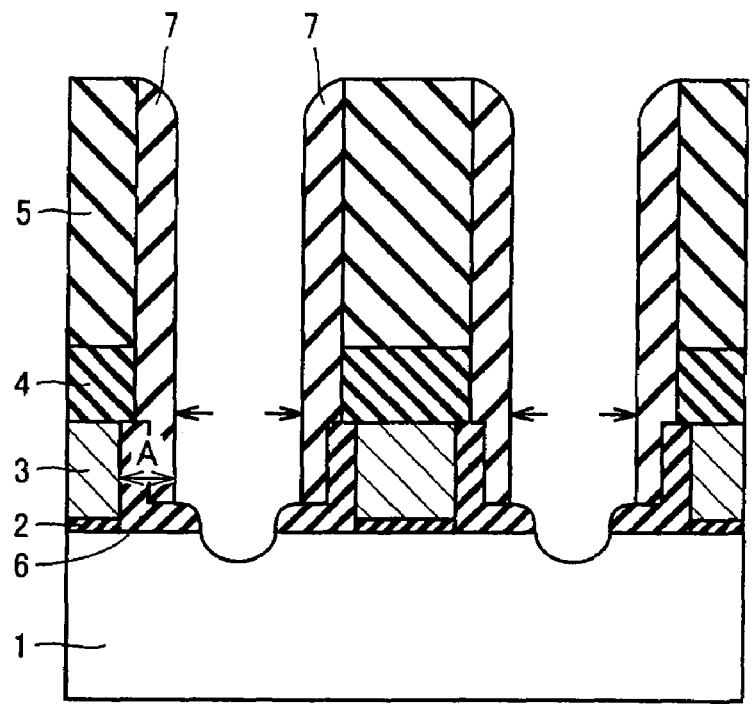

Referring to FIG. 19, an HF-based wet etching solution is used to reduce the surface of silicon oxide film 7 and the inner end portion of thermal oxide film 6. Since the silicon oxide film generally has an etching rate faster than that of the thermal oxide film, a structure as shown in FIG. 19 is obtained, in which silicon oxide film 7 is more reduced than thermal oxide film 6 in thickness. At the same time, a corner of the inner end portion of thermal oxide film 6 is removed, and the inner end portion of thermal oxide film 6 has a gently rounded shape. On this occasion, as shown in FIG. 19, the distance between the surface of silicon oxide film 7 constituting the side wall and the surface of conductor film 3 constituting the assist gate electrode is set to be identical to A as in FIG. 7.

Figure 20:
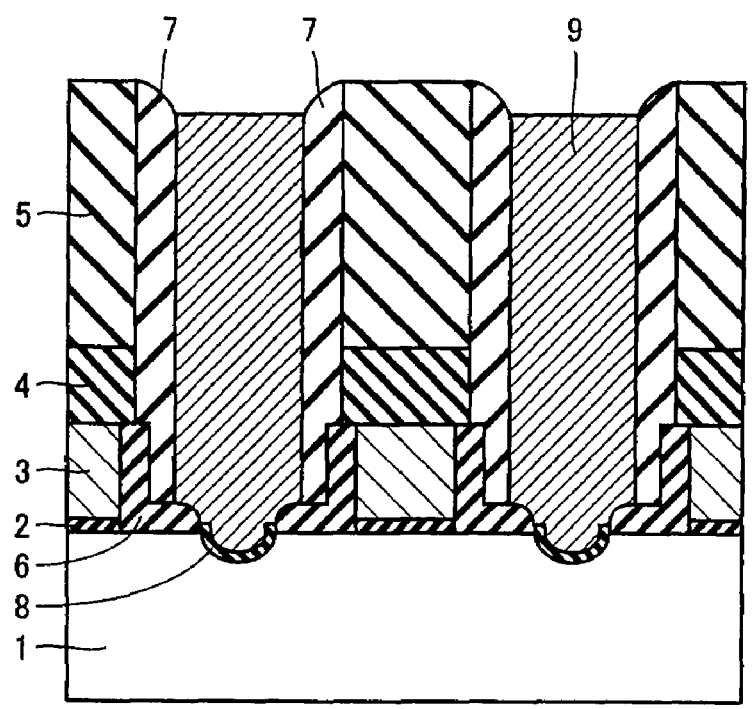

Referring to FIG. 20, thermal oxide film 8 is formed in the recess made in the former step in semiconductor substrate 1. Thermal oxide film 8 serves as a tunnel oxide film of the floating gate electrode. Thermal oxide film 8 (the second insulating film) is formed to be thinner than thermal oxide film 6 (the first insulating film). Further, conductor film 9 such as a low-resistance polysilicon film doped with P, As, or the like is deposited on the main surface of semiconductor substrate 1 by for example CVD. Thereafter, dry etching is performed on the surface of conductor film 9. Conductor film 9 is removed by dry etching until conductor film 9 fits into a position sandwiched between a pair of silicon oxide films 7 constituting the side walls. As a result, the upper surface of conductor film 9 becomes lower than the upper surface of silicon oxide film 5 in height.

Figure 21:
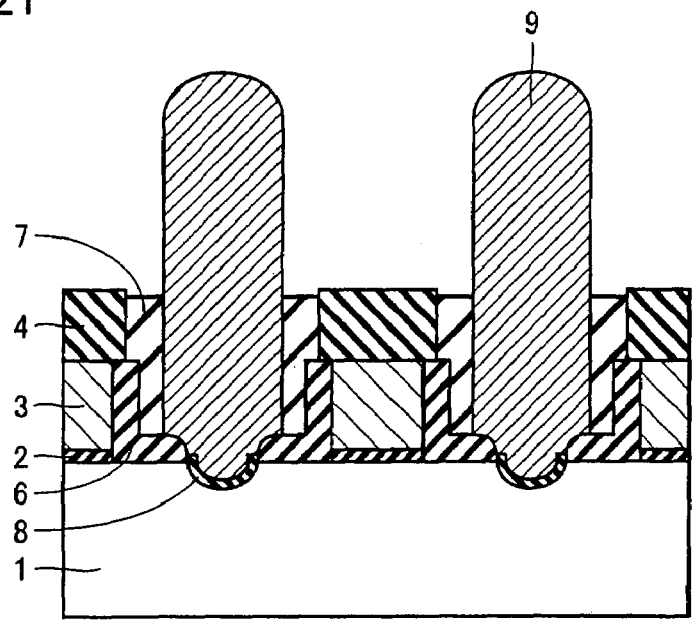

Referring to FIG. 21, dry etching is performed only on the memory cell portion. Through dry etching, silicon oxide film 5 is removed, and silicon oxide film 7 is also removed until the upper surface of silicon oxide film 7 is located adjacent to the side of nitride film 4. Thereby, conductor film 9 sandwiched between conductor films 3 constituting the assist gate electrodes and having the upper surface higher than that of conductor film 3 is formed, serving as the floating gate electrode.

Figure 22:
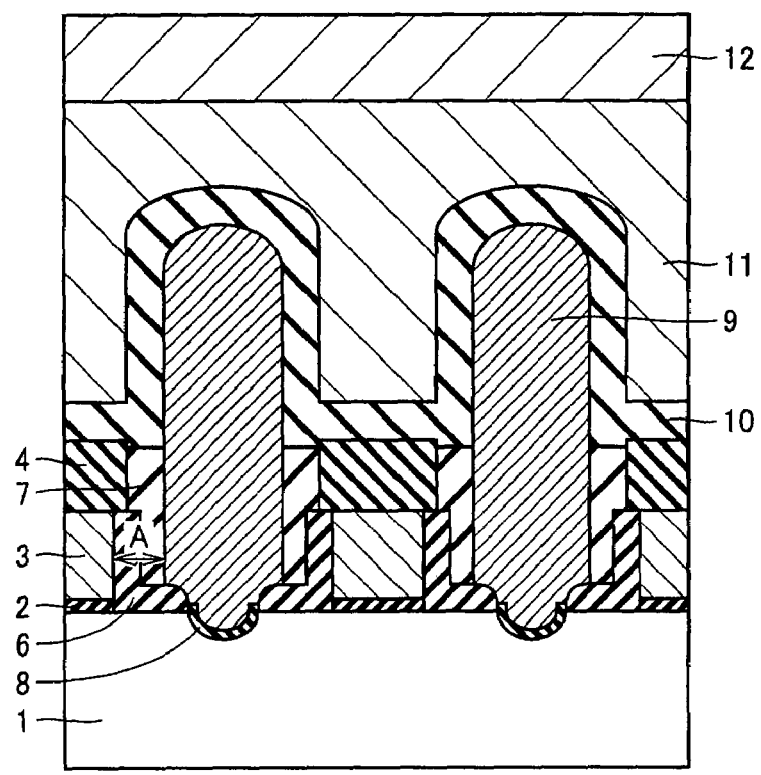

Referring to FIG. 22, ONO film 10, conductor film 11, and conductor film 12 are deposited in order on the main surface of semiconductor substrate 1. Conductor film 11 is made of such as a low-resistance polysilicon film doped with P, As, or the like, and conductor film 12 is made of such as a high melting point metal silicide film such as WSi. Conductor films 11 and 12 are patterned to extend in a direction orthogonal to conductor film 3 constituting the assist gate electrode, serving as the control gate electrode. Since distance A shown in FIG. 22 is identical to distance A in FIG. 7, a sufficient distance can be obtained between conductor film 9 constituting the floating gate electrode and conductor film 3 constituting the assist gate electrode. Thereby, insulation between the floating gate electrode and the assist gate electrode can be ensured. As a result, occurrence of current leakage therebetween can be prevented.

According to the semiconductor device in the present embodiment, the first insulating film (thermal oxide film 6) located at the both end portions below the floating gate electrode is formed thicker than the second insulating film (thermal oxide-film 8) located in the middle portion below the floating gate electrode, when seen from a direction orthogonal to the direction in which the control gate electrode extends. This structure can prevent concentration of an electric field on the edge of the floating gate electrode when the erase operation is performed by F-N tunnel release, reducing variations in the erase level. Further, since the surface of the first insulating film is formed to have a rounded shape in a cross section taken in the direction in which the control gate electrode extends, the concentration of the electric field on that portion can further be relieved.

Furthermore, since the second insulating film (thermal oxide film 8) is formed thicker, a distance between the floating gate electrode (conductor film 9) and an inversion layer formed in semiconductor substrate 1 by the assist gate electrode (conductor film 3) is increased. Consequently, even in the writing mode in which charge is injected into the floating gate electrode, it is possible to prevent the inversion layer formed below the assist gate electrode from being affected by the charge. This can prevent an increase in the resistance of the inversion layer due to reduction in the width of the inversion layer. As a result, an error during data read can be reduced, and a potential reached during data write can be improved.

Further, since the second insulating film in the middle portion below the floating gate electrode is formed to have a rounded shape and its lower surface is located lower than the surface of semiconductor substrate 1, the effective channel length below the floating gate electrode can be increased. This can reduce punchthrough leakage. Furthermore, since an etching damage layer remaining in semiconductor substrate 1 close to its surface is removed by dry etching, defective leakage can be reduced.

Although explanation has been given on the semiconductor device having an assist gate electrode in the present embodiment, the invention in accordance with the present embodiment is also applicable to a semiconductor device having no assist gate electrode, and effects similar to those described above can also be obtained in such a case.

Further, in the semiconductor device shown in FIG. 7 described above as the basis for the present invention, as shown in FIG. 23, a recess may be formed in the surface of the semiconductor substrate sandwiched between the sidewalls, and a thermal oxide film having a rounded shape may be formed such that its lower surface is located lower than the surface of semiconductor substrate 1 as in the present embodiment. Also in this case, defective leakage can be reduced by removing an etching damage layer. In addition, since the effective channel length below the floating gate electrode can be increased as shown in FIG. 24, punchthrough leakage can be reduced.

Third Embodiment

Figure 25:
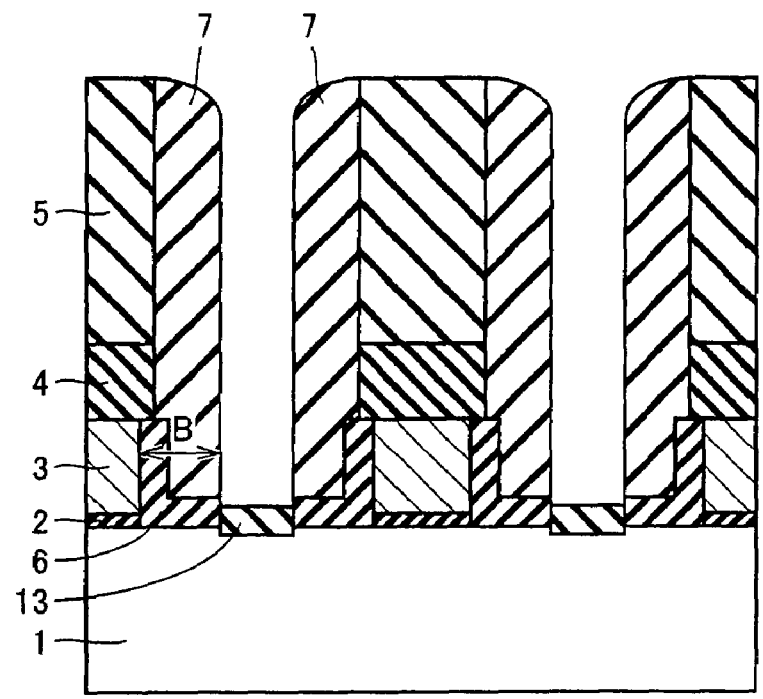
FIG. 25 is a cross sectional view illustrating a step of manufacturing a semiconductor device of a third embodiment in accordance with the present invention.

Next, a third embodiment will be described with reference to FIG. 25. In the following description, components corresponding to those in the first embodiment are indicated by like reference numerals, and description thereof will not be repeated. FIG. 25 is a cross sectional view illustrating a step in a method of manufacturing a semiconductor device of the present embodiment.

Figure 11:
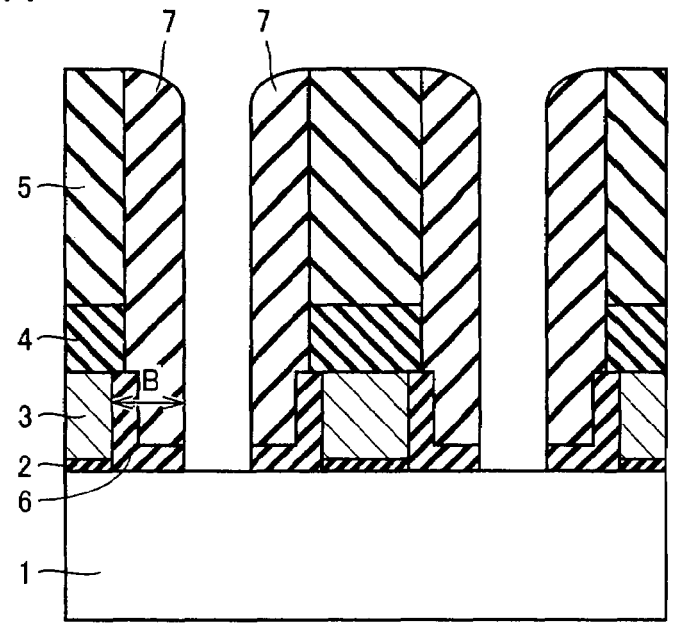
FIGS. 11 to 15 are cross sectional views illustrating steps of manufacturing a semiconductor device of a first embodiment in accordance with the present invention.

Up to the step shown in FIG. 11 described above, the method of manufacturing the semiconductor device in accordance with the present embodiment is the same as that in the first embodiment. In the present embodiment, following this step, thermal oxidization is performed as shown in FIG. 25, immediately before the step of reducing the side wall described in FIG. 12 using a wet etching solution. Thereby, an etching damage layer remaining in semiconductor substrate 1 is oxidized to be a thermal oxide film 13. Thereafter, thermal oxide film 13 is removed by wet etching as described in FIG. 12.

The etching damage layer remaining in semiconductor substrate 1 can be removed by adding the step of thermal oxidization described above to the manufacturing method described in the first embodiment. Thereby, defective leakage due to the etching damage layer can be reduced. Other effects obtained by the semiconductor device of the present embodiment is the same as those obtained by the semiconductor device described in the first embodiment.

Fourth Embodiment

Figure 26:
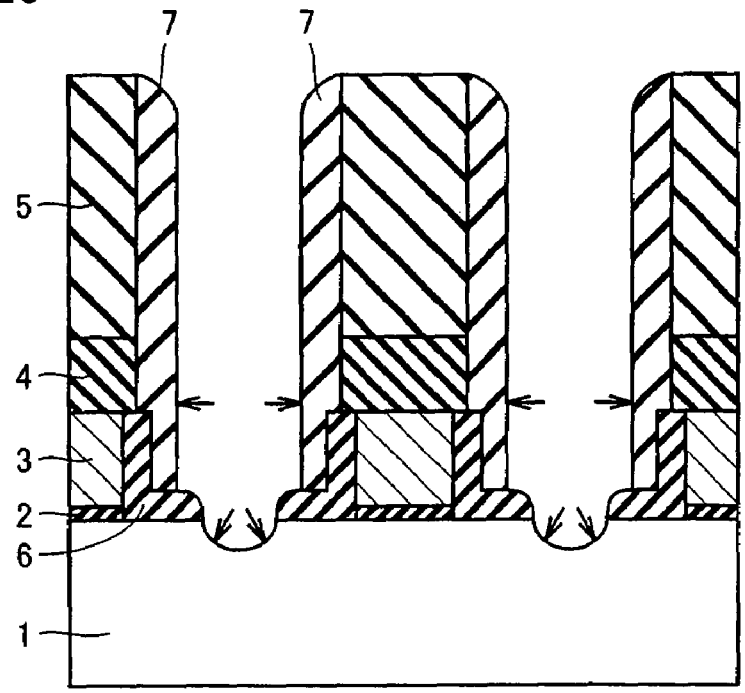
FIG. 26 is a cross sectional views illustrating a step of manufacturing a semiconductor device of a fourth embodiment in accordance with the present invention.

Next, a fourth embodiment will be described with reference to FIG. 26. In the following description, components corresponding to those in the first embodiment are indicated by like reference numerals, and description thereof will not be repeated. FIG. 26 is a cross sectional view illustrating a step in a method of manufacturing a semiconductor device of the present embodiment.

Figure 18:
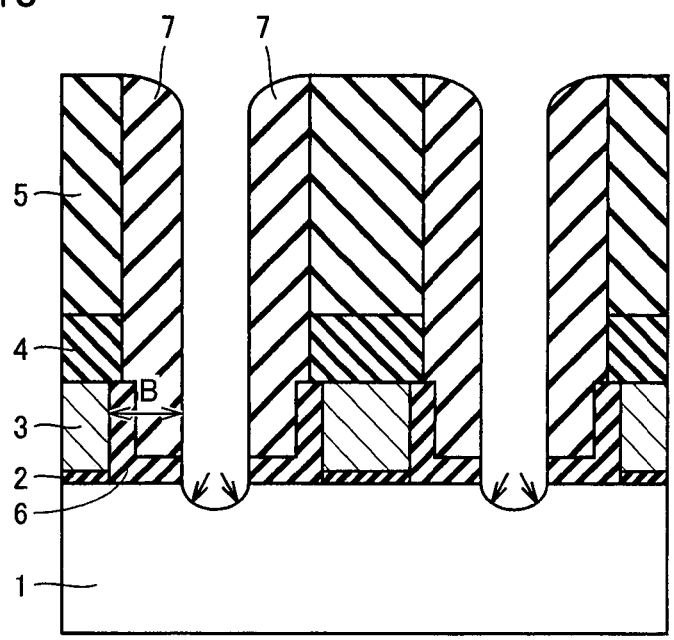
FIGS. 18 to 22 are cross sectional views illustrating steps of manufacturing a semiconductor device of a second embodiment in accordance with the present invention.

Up to the step shown in FIG. 11 described above, the method of manufacturing the semiconductor device in accordance with the present embodiment is the same as that in the second embodiment. In the second embodiment, following this step, as shown in FIG. 18, anisotropic dry etching is performed to form a recess in the surface of semiconductor substrate 1 sandwiched between the first insulating films (thermal oxide films 6). Thereafter, as shown in FIG. 19, the surface of silicon oxide film 7 and the inner end portion of thermal oxide film 6 are reduced using a wet etching solution. In contrast, in the present embodiment, as shown in FIG. 26, isotropic dry etching is performed to reduce the surface of silicon oxide film 7 (side wall) and the inner end portion of thermal oxide film 6 (the first insulating film), and at the same time to form a recess in the surface of semiconductor substrate 1 sandwiched between thermal oxide films 6.

By performing isotropic dry etching, treatment requiring two steps in the second embodiment can be completed in only one step, and thus the number of steps in the manufacturing process can be reduced. The semiconductor device manufactured ultimately is the same as that in the second embodiment. Therefore, also in the semiconductor device in the present embodiment, effects similar to those described in the second embodiment can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising:
    a semiconductor substrate having a main surface;
    an insulating film formed on the main surface of said semiconductor substrate;
    a floating gate electrode formed on the main surface of said semiconductor substrate via said insulating film; and
    an assist gate electrode provided on both sides of said floating gate electrode via a side wall to form an inversion layer in said semiconductor substrate,
    said insulating film having a first insulating film located at both end portions below said floating gate electrode and a second insulating film sandwiched between said first insulating films and located in a middle portion below said floating gate electrode, and said first insulating film being thicker than said second insulating film,
  comprising the steps of:
    forming said assist gate electrode at an appropriate position on the main surface of said semiconductor substrate;
    performing thermal oxidization on the surface of said semiconductor substrate sandwiched between said assist gate electrodes to form a thermal oxide film serving as said first insulating film;
    forming said side wall made of a silicon oxide film on a side of said assist gate electrode and removing a middle portion of said oxide film; and
    performing wet etching to reduce a surface of said side wall and an inner end portion of said oxide film simultaneously.

2. The method of manufacturing a semiconductor device according to claim 1, further comprising the step of forming a recess in the surface of said semiconductor substrate sandwiched between said oxide films after said step of forming said side wall and removing the middle portion of said oxide film.

3. The method of manufacturing a semiconductor device according to claim 1, further comprising the step of performing thermal oxidization on said semiconductor substrate to oxidize an etching damage layer remaining in said semiconductor substrate immediately before said step of forming said side wall and removing the middle portion of said oxide film,
    wherein said oxidized etching damage layer is also removed in said step of performing wet etching to reduce the surface of said side wall and the inner end portion of said oxide film simultaneously.

4. The method of manufacturing a semiconductor device according to claim 1, comprising the step of performing isotropic dry etching instead of said step of performing wet etching to reduce the surface of said side wall and the inner end portion of said oxide film simultaneously, to reduce the surface of said side wall and the inner end portion of said oxide film and at the same time to form a recess in the surface of said semiconductor substrate sandwiched between said oxide films.

* * * * *